United States Patent [19]

Crowley

[11] 4,105,947
[45] Aug. 8, 1978

[54] PULSE WAVE PHASE AND FREQUENCY DETECTOR

[75] Inventor: Albert Timothy Crowley, Somerdale, N.J.

[73] Assignee: RCA Corporation, New York, N.Y.

[21] Appl. No.: 833,750

[22] Filed: Sep. 16, 1977

[51] Int. Cl.$^2$ ............................................. H03B 3/04
[52] U.S. Cl. ................................. 331/1 A; 307/232; 328/134
[58] Field of Search ...................... 331/1 A; 307/232; 328/133, 134

[56] References Cited

U.S. PATENT DOCUMENTS

| 3,350,658 | 10/1967 | Walker | 331/1 A |
| 3,808,407 | 4/1974 | Ratz | 328/133 |
| 3,989,931 | 11/1976 | Philips | 328/134 |

*Primary Examiner*—John Kominski
*Attorney, Agent, or Firm*—H. Christoffersen; Samuel Cohen; Carl V. Olson

[57] ABSTRACT

A phase and frequency detector includes a first flip-flop triggered by a pulse wave from a reference source, and a second flip-flop triggered by a pulse wave from a voltage-controlled oscillator. Gate means couple outputs of the flip-flops back to reset inputs of the flip-flops so that one of the flip-flops generates pulses having widths proportional to the phase difference of the first and second pulse waves. The gate means inhibits the resetting of the triggered flip-flop when the pulses of the first and second pulse waves do not overlap, so that the triggered flip-flop then generates a continuous output useful for rapidly correcting the frequency of the voltage-controlled oscillator.

6 Claims, 7 Drawing Figures

PHASE CHARACTERISTIC

FREQUENCY CHARACTERISTIC

PHASE CHARACTERISTIC

FREQUENCY CHARACTERISTIC

PULSE WAVE PHASE AND FREQUENCY DETECTOR

This invention relates to phase and frequency detectors which are useful, for example, in frequency synthesizers. The invention relates particularly to a phase and frequency detector which provides an output suitable for application to a voltage-controlled oscillator to cause a very rapid change in the frequency of the oscillator to a desired frequency, followed by an appropriate change in the phase of the oscillator.

According to an example of the invention, a phase and frequency detector includes a first flip-flop triggered by a first pulse wave, and a second flip-flop triggered by a second pulse wave. Gate means coupled to the reset inputs of the flip-flops cause the output fom one of the flip-flops, depending on the sense of the error, to be proportional to the phase difference between the pulse waves when the pulses of the two pulse waves overlap, and having outputs of a high constant value when the pulses of the two pulse waves do not overlap.

Figure 1:
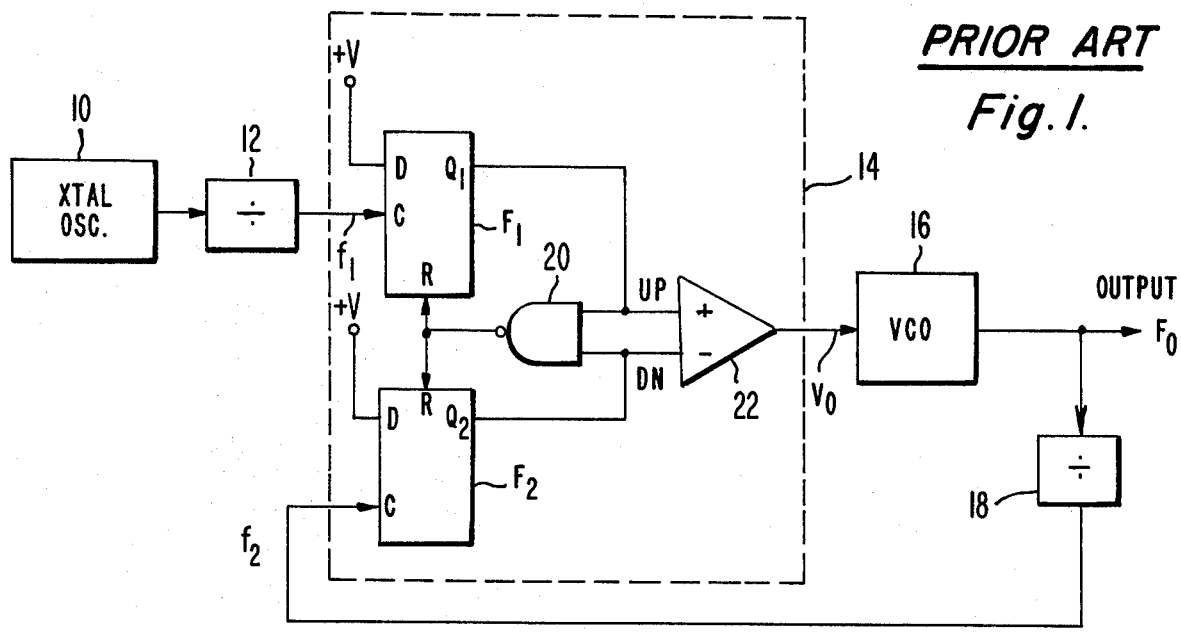
FIG. 1 is a schematic diagram of a frequency synthesizer including a phase locked loop which in turn includes a phase and frequency detector according to the prior art.

Referring now in greater detail to FIG. 1, the frequency synthesizer shown includes a crystal oscillator 10, a fixed divider 12, a phase and frequency detector within the dashed line box 14, a voltage-controlled oscillator 16 and a programmable frequency divider 18. The phase and frequency detector 14 compares the positive edge of the pulse wave $f_1$ from the divider 12, and the positive edge of the pulse wave $f_2$ from the divider 18, and produces a control voltage $V_o$ which is supplied to the voltage-controlled oscillator 16 to cause the output frequency $F_0$ from the oscillator to equal the frequency of the signal from the divider 12 times to division ratio of divider 18.

The phase and frequency detector 14 includes a positive-edge-triggered Type D flip-flop $F_1$ having a trigger input C for an input pulse wave $f_1$, a Q output and a reset input R. An identical flip-flop $F_2$ includes a trigger input C for a reference pulse wave $f_2$. The flip-flops $F_1$ and $F_2$ may be Type SN7474 units manufactured by Texas Instruments. A "nand" gate 20 has inputs from the outputs to the two flip-flops $F_1$ and $F_2$ and has an output connected to the reset inputs R of the two flip-flops. The outputs of the two flip-flops are also connected to respective + and − inputs of a differential amplifier and integrator 22 which may be a Type U741 unit manufactured by the Fairchild Semiconductor.

Figure 2:
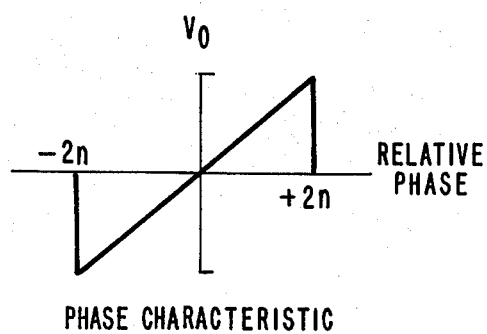
FIG. 2 is a diagram describing the phase-voltage characteristics of the phase and frequency detector circuit included in FIG. 1.

In the operation of the phase and frequency detector 14, a pulse of the pulse wave $f_1$ may arrive and trigger the flip-flop $F_1$ producing a high output at $Q_1$. Assuming that the pulse of wave $f_1$ is followed by a pulse of the wave $f_2$, the latter pulse triggers the flip-flop $F_2$ into conduction and causes a high output at $Q_2$. Under these conditions the "nand" gate 20 is enabled (in response to two highs, each representing binary 1, it produces a low, representing binary 0) and it supplies reset (low level) signals to the reset inputs R of both flip-flops. The output from flip-flop $F_1$ is thus a pulse beginning with the leading edge of the pulse supplied to the trigger input and ending with the leading edge of the pulse supplied to the trigger input of the other flip-flop $F_2$. The output of flip-flop $F_1$ is thus a pulse wave in which the pulses have durations proportional to the phase difference between the two input pulse waves $f_1$ and $f_2$. If, on the other hand, the pulse of wave $f_2$ preceded the pulse of wave $f_1$, the operation is transposed so that the flip-flop $F_2$ provides the output pulses having widths proportional to the phase difference. The pulse waves from the flip-flops are applied to the differential integrator 22 which produces a voltage $V_o$ which varies in amplitude and polarity in accordance with the phase differences of the two input pulse waves according to the characteristics shown in FIG. 2.

Figure 3:
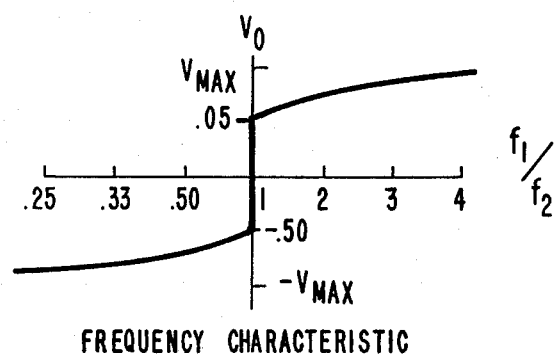
FIG. 3 is a graph illustrating the frequency-voltage characteristics of the phase and frequency detector included in FIG. 1.

The way in which the amplitude and polarity of the output voltage $V_o$ varies with the frequency of pulse wave $f_1$ divided by the frequency of the pulse wave $f_2$ is shown in FIG. 3. It is seen that the voltage $V_o$ varies from one half the maximum value to the maximum value. It is seen from this characteristic that, over a considerable range of frequency differences, the correction voltage $V_o$ supplied to the voltage-controlled oscillator 16 in FIG. 1 is considerably less than the maximum value and is consequently not operative to change the frequency of the voltage-controlled oscillator to a new frequency as rapidly as is desired.

Figure 4:
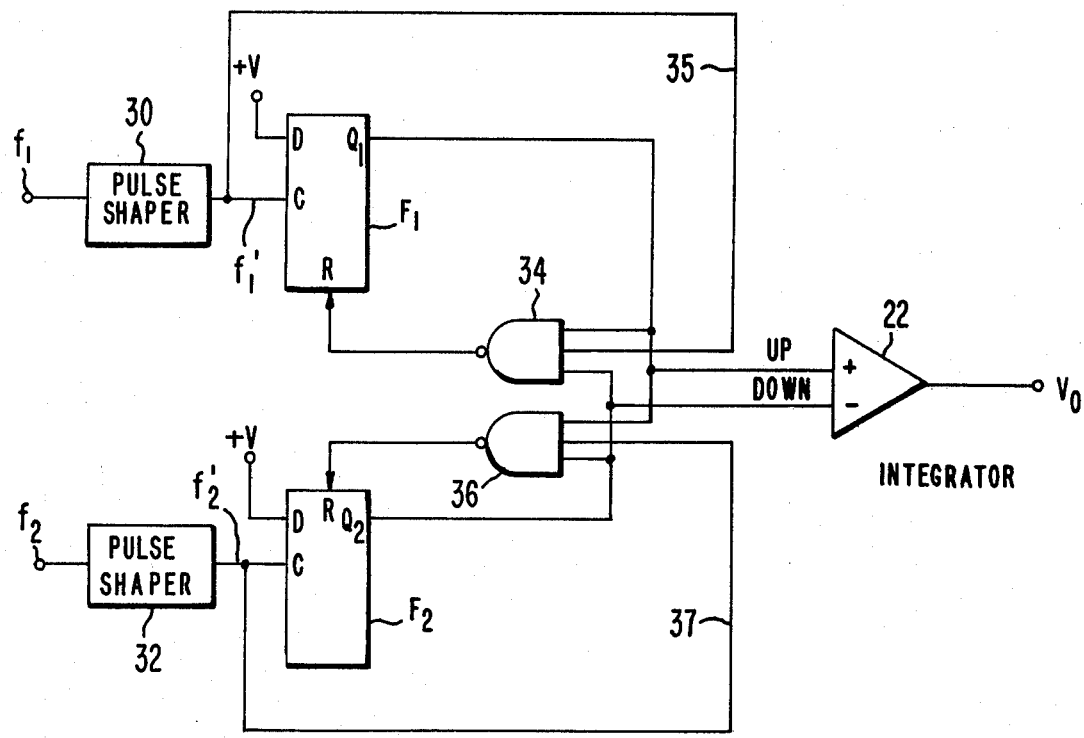
FIG. 4 is a schematic diagram of a phase and frequency detector constructed according to the teachings of this invention and useful in the system of FIG. 1 in place of the prior art detector therein.

FIG. 4 shows an improved faster-acting phase and frequency detector in which elements corresponding to those in FIG. 1 are given the same reference designations. The detector of FIG. 4 differs from the detector of FIG. 1 in that the input pulse waves $f_1$ and $f_2$ are applied through respective pulse shapers 30 and 32 to produce input pulse waves $f'_1$ and $f'_2$ which have pulses of limited widths, such as 10% of the periods of the pulse waves. The actual percentage figure adopted for the widths of the input pulses determines the dividing point between the two different modes of operation of the detector, as will become apparent as the description proceeds.

The detector of FIG. 4 includes two "nand" gates 34 and 36. The two "nand" gages 34 and 36 have each two inputs from the outputs of the two flip-flops $F_1$ and $F_2$ for operation in the same way as the "nand" gate 20 and FIG. 1. However, "nand" gate 34 has a third input on line 35 from the output of pulse shaper 30 providing the pulse wave $f'_1$. Similarly, the "nand" gate 36 has a third input over line 37 from the output of pulse shaper 32 providing the reference pulse wave $f'_2$. (A "nand" gate is, of course, an "and" gate having an inverted output. The "nand" gates are used because the flip-flops $F_1$ and $F_2$ happen to require inverted reset pulses.)

Figure 5:
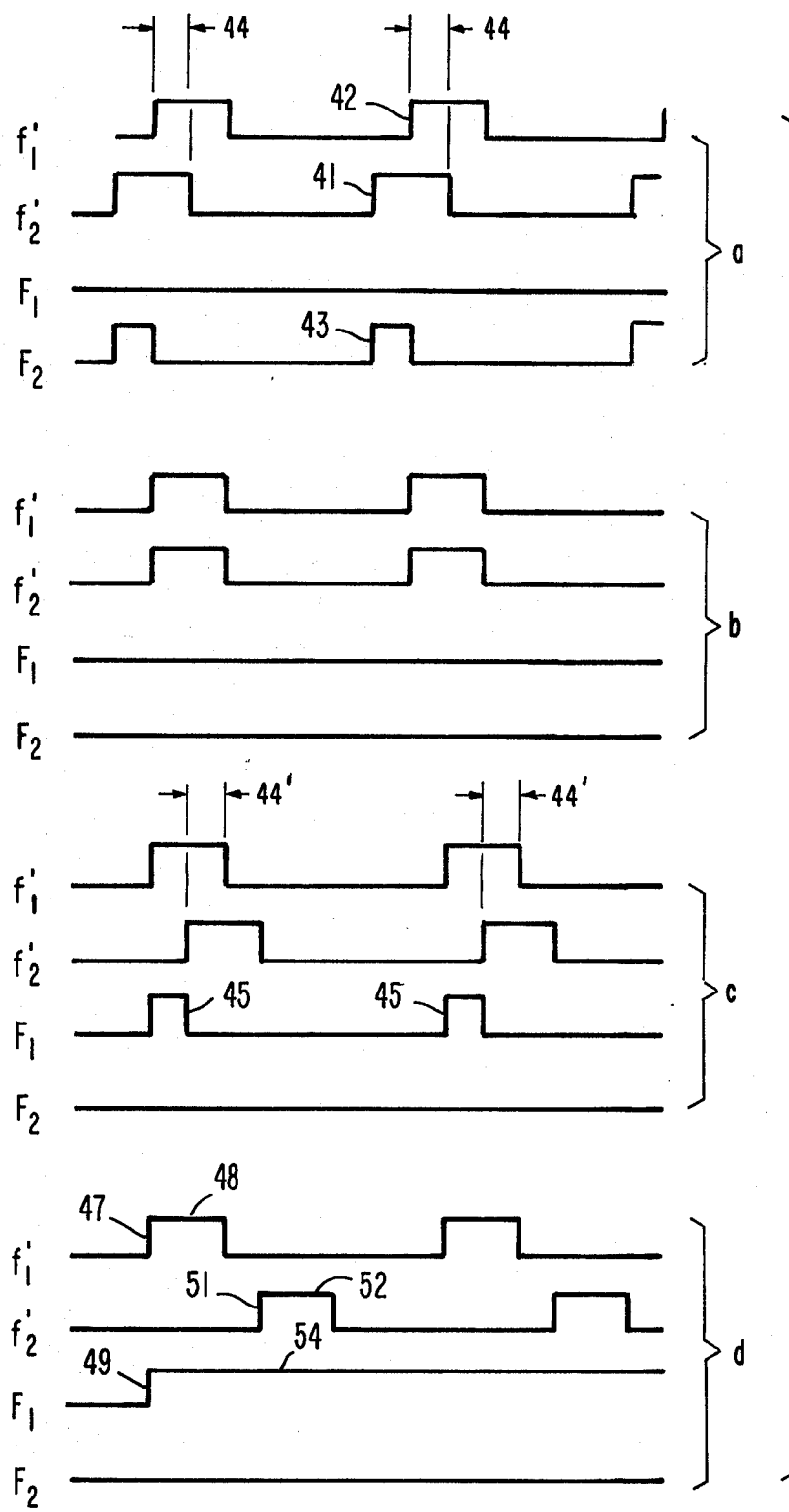
FIG. 5 is a chart of voltage waveforms which will be referred to in describing the operation of the phase and frequency detector of FIG. 4.

The operation of the phase and frequency detector of FIG. 4 will be described with reference to the waveforms shown in FIG. 5. The waveforms 5a describes the operation when the pulses of the second pulse wave $f_2$ preceeds the pulses of the first pulse wave $f_1$. Under these conditions, the flip-flop $F_2$ is triggered on by the leading edge 41 of the pulse of the pulse wave $f_2$, and the flip-flop $F_1$ is triggered on by the leading edge 42 of the pulse wave $f_1$. When both flip-flops $F_1$ and $F_2$ are triggered, and pulses $f_1$ and $f_2$ overlap, both gates 34 and 36 are enabled, resetting flip-flops $F_1$ and $F_2$. The flip-flop $F_2$ produces the output pulse 43, and the flip-flop $F_1$ does not remain "on" for any significant period of time. The "nand" gates 34 and 36 operate to reset the two flip-flops during the intervals designated 44 in FIG. 5a when the two pulses of waves $f_1$ and $f_2$ overlap. The output from flip-flop $F_2$ is applied to the minus input of integrator 22, and the output $V_o$ of the integrator is of negative polarity.

FIG. 5b shows the waveforms under the conditions when the two input signals or pulse waves $f_1$ and $f_2$ are exactly equal in frequency and phase. Under this condition, neither of flip-flops $F_1$ or $F_2$ is triggered into conduction for any significant period of time. Consequently there is a zero output voltage $V_o$ from the integrator 22 of the phase and freqeuncy detector.

FIG. 5c shows the voltage waveforms when the pulses of pulse wave $f_2$ follow the pulses of pulse wave $f_1$. In this case, the flip-flop $F_1$ is the one which produces an output pulse wave having pulses 45 with a width proportional to the phase difference 44' between the two pulse waves. Since the output from the flip-flop $F_1$ is applied to the positive input of integrator 22, the output voltage $V_o$ has a positive polarity.

The waveforms of FIG. 5d illustrate the conditions when the pulses of the $f_1$ and $f_2$ pulse waves do not overlap because the phases or the frequencies of the pulse waves are substantially different from each other. The condition is illustrated where the leading edge 47 of the pulse 48 of first pulse wave $f_1$ triggers the flip-flop $F_1$ into conduction to provide an output shown at $F_1$ starting with a leading edge 49. When the leading edge 51 of pulse 52 of pulse waves $f_2$ arrives to trigger "on" the flip-flop $F_2$, the output from the flip-flop $F_2$ is unable to reset the flip-flop $F_1$ because the "nand" gate 34 is inhibited by not having applied thereto the pulse 48 of the pulse wave $f_1$. However, gate 36 is enabled because pulse 52 is now applied to the input of this gate. Therefore flip-flop $F_2$ is immediately reset. Consequently the output 54 of flip-flop $F_1$ continues at a constant maximum amplitude, and flip-flop $F_2$ is, except for a narrow spike, (too narrow to justify inclusion in the drawing), at a constant minimum value. Therefore the integrator 22 provides a maximum continuous correction voltage $V_o$ for application to a voltage-controlled oscillator to cause the oscillator to change its frequency very rapidly to the desired frequency dictated by the frequency of the pulse wave $f_1$. If pulse $f_2$ leads pulse $f_1$, the action of the flip-flops is transposed.

Figure 6:
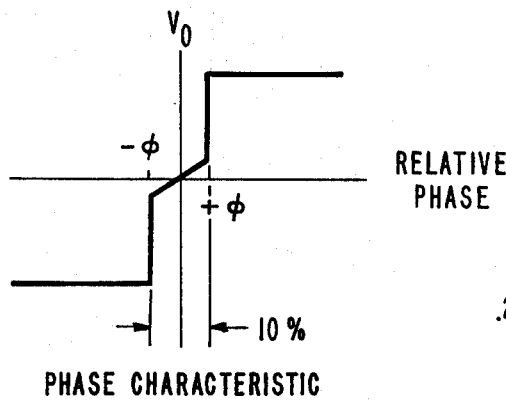
FIG. 6 is a chart of the voltage-phase characteristics of the phase and frequency detector of FIG. 4.
Figure 7:
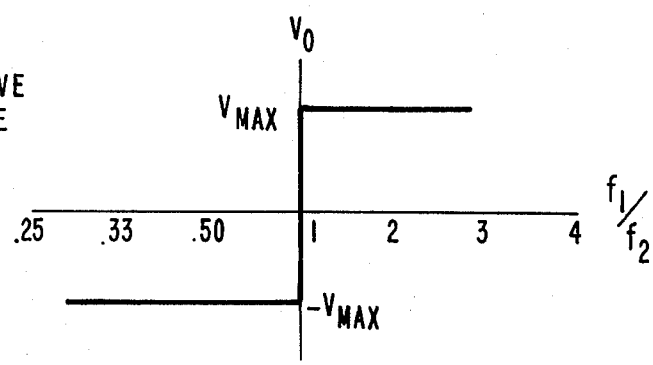
FIG. 7 is a chart of the voltage-frequency characteristics of the phase and frequency detector of FIG. 4.

The improved phase and frequency characteristic of the detector of FIG. 4 are shown in FIGS. 6 and 7, respectively. It can be seen by comparing these characteristics with those in FIGS. 2 and 3 that the correction voltage $V_o$ from the detector has a maximum value to cause a very rapid correction of the frequency of the voltage-controlled oscillator for the majority of the time when such action is needed.

FIG. 6 shows that when the pulses of the pulse waves overlap, the output voltage $V_o$ varies in proportion with the phase difference of the pulses. However when the phases of the pulse waves are significantly different from the desired relationship, the output voltage $V_o$ is abruptly made very large to cause a rapid correction. This condition obtains when the pulses of the two pulse waves do not overlap. Since the pulse widths may be made about 10% of the periods of the pulse waves, the large corrective output voltage is provided during all but 10% (36°) of the possible phase relationships.

It is also seen from the characteristic shown in FIG. 7 that the output voltage $V_o$ is always a maximum positive, or maximum negative, value except when the two frequencies are exactly equal. It is accordingly apparent that the improved phase and frequency detector of FIG. 4 is capable of achieving phase and frequency lock in a relatively very short time.

What is claimed is:

1. A phase and frequency detector, comprising
   first and second flip-flops each having a leading edge trigger input, an output and a reset input,
   means to apply a first pulse wave to the trigger input of said first flip-flop,
   means to apply a second pulse wave to the trigger input of said second flip-flop, and
   gate means responsive to outputs of said flip-flops and to said first and second pulse waves to apply reset signals to reset inputs of both flip-flops solely during the times that the first and second pulses overlap in time.

2. The combination as defined in claim 1 wherein said gate means comprises a first "and" gate enabled by the outputs of said first and second flip-flops and by the first pulse wave and having an output coupled to the reset input of said first flip-flop, and a second "and" gate enabled by the outputs by the outputs of said first and second flip-flops and by the second pulse wave and having an output coupled to the reset input of said second flip-flop.

3. The combination as defined in claim 2, and in addition, means to differentially integrate the output pulses of said first an second flip-flops to produce an output signal varying in amplitude and polarity with the amount and polarity of the phase differences between said first and second pulse waves when the pulses of the two waves overlap, and having a maximum amplitude with a polarity determined by whether the first pulse wave has a higher or a lower frequency than the second pulse wave when the pulses of the two pulse waves do not overlap.

4. The combination as defined in claim 3, and in addition, a voltage-controlled oscillator receptive to said output signal.

5. The combination as defined in claim 4, and in addition, a pulse shaper coupling the output of said voltage-controlled oscillator to the trigger input of said second flip-flop.

6. The combination as defined in claim 5, and in addition, a crystal oscillator having an output coupled through a second pulse shaper to the trigger input of said first flip-flop.

* * * * *